United States Patent [19]

Pao et al.

[11] Patent Number: 5,270,798
[45] Date of Patent: Dec. 14, 1993

[54] HIGH ELECTRON MOBILITY TRANSISTOR

[75] Inventors: Yi-Ching Pao, San Jose; James S. Harris, Stanford, both of Calif.

[73] Assignee: Varian Associates, Inc., Palo Alto, Calif.

[21] Appl. No.: 481,849

[22] Filed: Feb. 20, 1990

[51] Int. Cl.$^5$ .................... H01L 29/80; H01L 29/205
[52] U.S. Cl. .................................... 257/134; 257/12; 257/183
[58] Field of Search ................. 357/22, 16, 4

[56] References Cited

U.S. PATENT DOCUMENTS 4,916,498  4/1990  Berenz ................. 357/22

FOREIGN PATENT DOCUMENTS 5691477   7/1981   Japan ................. 357/22
63308965 12/1988   Japan ................. 357/22

OTHER PUBLICATIONS

"A High Aspect Ratio Design Approach to Millimeter-Wave HEMT Structures", M. B. Das, IEEE Trans. Electron Devices, ED-32(1), p. 11 (1985).
"DC and RF Performance of 0.1um Gate Length $Al_{0.48}In_{0.52}As$-$Ga_{0.38}In_{0.62}As$ Pseudomorphic HEMTs" by U. K. Mishra, et al., IEEE IEDM-88 p. 180 (1988).
"Extremely High Gain, Low Noise in AlAs/InGaAs HEMTs Grown by Molecular Beam Epitaxy" by P. Ho, et al. IEEE IEDM-88 p. 184(1988).
"Ultra-High-Speed Digital Circuit Performance in 0.2-um Gate Length AlInAs/GaInAs HEMT Technology", U. K. Mishra, et al. 9 IEEE Electron Device Letters, No. 9, p. 482(1988).
"A Recessed Gate $Al_{0.48}In_{0.52}As$/$Ga_{0.47}In_{0.53}As$ Modulation Doped Field Effect Transistor" T. Itoh, et al., paper presented at the Tenth Annual IEEE/Cornell Conf. on Advanced Concepts in High Speed Semicond. Dev. & Ckts. (1985).
"DC and Microwave Characteristics of InAlAs/InGaAs Single-Quantum-Well MODFET's with GaAs Gate Barriers", W. P. Hong, et al., 9 IEEE Electron Device Letters, No. 7, P. 352 (1988).
"HEMT Millimetre Wave Monolithic Amplifier on InP", M. Riaziat, et al., 25 Electronics Letters, No. 20, p. 1328 (1989).
"Two-Dimensional Simulation of Submicrometer GaAs MESFET's: Surface Effects and Optimization of Recessed Gate Structures", F. Heliodore, et al., 35 IEEE Transactions on Electron Devices, No. 7, p. 824 (1988).

Primary Examiner—Jerome Jackson, Jr.
Attorney, Agent, or Firm—Stanley Z. Cole; Gerald M. Fisher

[57] ABSTRACT

A high-electron mobility transistor or HEMT has a top surface layer between its gate and drain arranged to produce a channel to drain conductance that is close to the ungated channel conductance to lower the output conductance and reduce gate leakage and gate capacitance. The transistor has a high band-gap active layer to produce a 2DEG channel in an adjacent layer, and source, gate and drain electrodes on the active layer. An undoped or lightly doped surface layer in the region between the gate and the drain produces a low conductance for a region of a few hundred Å from the drain-side edge of the gate. This spreads the electric field domain over at least this few hundred Å distance.

15 Claims, 4 Drawing Sheets

HIGH ELECTRON MOBILITY TRANSISTOR

BACKGROUND OF THE INVENTION

This invention relates to field effect transistors and more particularly to metal-semiconductor field effect transistors or MESFETS. This invention is more specifically concerned with modulation doped field effect transistors (MODFETs) or high-electron mobility transistors (HEMTs) which can operate at microwave and millimeter wave frequencies.

HEMTs have demonstrated excellent gain and low noise at extremely high frequencies, but high output conductance and significant gate leakage current have limited the performance of HEMTs.

Generally speaking, a HEMT transistor has a substrate on which a buffer layer is grown of a semiconductor material such as a III-V compound having a lattice constant that closely matches the substrate. A layer of low band-gap semiconductor material is grown on the buffer layer, and a layer of high-band gap material is grown on the low-band gap layer. Source, gate, and drain electrodes are metallized onto an upper surface.

A cap layer of Si-doped low-band gap material is formed on the upper layer of high band-gap material, and the electrodes are metallized onto this cap layer. A recess is etched through this for the metallization of the gate electrode onto the high band gap material. For the surface doped device, there is a reasonably high output conductance, e.g. 50 mS/mm. The highly doped cap layer has a high conductance, so that the entire cap layer on the drain side of the recess is at substantially the same potential as the drain. While this has the effect of shortening the gate channel-to-drain current path, it also places a sharp potential drop in the short distance from the gate to the edge of the recess (i.e., 100 to 300 angstroms). For a given gate potential $V_{gs}$, as the drain potential $V_{ds}$ is increased, the channel potential gradient in the short zone near the gate becomes quite large because the potential difference between the gate and drain is concentrated in the short distance from the drain-side edge of the gate to the edge of the recess. This imparts a high electric field near the drain side edge of the gate.

A consequence of increasing the drain to gate potential $V_{dg}$ is to generate a high electric field domain near the drainside gate edge. Because the buffer layer below the low band gap material is close to source potential, there is some leakage from the two dimensional electron gas sheet charge into the buffer. This reduces the charge control capability of the gate electrode, and the output conductance $g_o$ increases (where $g_o = I_{ds}/V_{ds}$).

A high-performance quarter-micron gate length surface-doped InAlAs/InGaAs/InP high electron mobility transistor can have a DC output conductance $g_o$ of 50 mS/mm or more, and its maximum or cutoff frequency $f_{max}$ is limited to perhaps 100 GHz, with a unity current gain cutoff frequency of perhaps 70 GHz.

The sharp potential drop at the gate edge is also responsible for significant gate leakage current. This is important especially in power applications where the gate input voltage is limited by gate leakage.

OBJECTS AND SUMMARY OF THE INVENTION

Accordingly it is an object of this invention to provide an FET that has improved upper frequency performance and minimal gate leakage, and is especially adaptable to use in digital, power, low-noise, and extreme high frequency operation.

It is another object of this invention to provide a high electron mobility transistor (HEMT) that is based on simple and straightforward design concepts, and relies on the electrical behavior of a surface layer to achieve its superior performance characteristics.

In accordance with an aspect of this invention, a HEMT is formed on a semi-insulating substrate, e.g., undoped InP. A buffer layer of undoped semi-conductor material is grown onto the substrate. This can be either a small band gap material, such as InGaAs, or a large band gap material, such as InAlAs. A channel layer of substantially undoped small band gap material is grown on the buffer layer, and a thin spacer layer of undoped large band gap material is grown on the channel layer. This layer is effective to create a two-dimensional electron gas (2DEG) channel in the channel layer. A sheet-charge layer is grown on the spacer layer and is formed of the large band gap material doped to achieve an effective sheet charge density on the order of about $2 \times 10^{12}$ to $10 \times 10^{12}$ cm$^{-2}$. A surface layer of the large band gap material, which can be either undoped or very mildly doped, is grown on the sheet-charge layer. Source and drain electrodes are metallized in source and drain regions, either directly on the surface layer or on a heavily-doped layer of semiconductor material in the source and drain regions, and a gate electrode is metallized in a gate region between the source and drain regions. The gate electrode is electrically biased to control the conductivity in the two-dimensional electron gas channel beneath the gate electrode. This channel has a predetermined gated conductivity. There is a drain-channel region defined from the drain-side edge of the gate electrode to the drain region, and this region has a drain-channel conductivity. The surface layer in this drain-channel region is structured so as to render the drain-channel conductivity, at least in the first 500 Å from the drain-side edge of the gate electrode, to between 1 and 2 times the gated channel conductivity. This spreads the potential gradient between the gate and the drain, so that the electric field domain extends out over at least the first 500 Å from the gate electrode. If the surface layer is mildly doped, it is doped only to a density of about $5 \times 10^{16}$ cm$^{-3}$ or less. Also preferably the surface layer has a net sheet charge density of less than 20% of the sheet charge density of the sheet-charge layer below it.

The HEMT can be formed of any of a number of systems, e.g., particularly the III-V InGaAs and InAlAs on an InP substrate, GaAs and AlGaAs on a GaAs substrate, or AlGaAs and InGaAs on a GaAs substrate.

The above and many other objects, features, and advantages of this invention will be more fully appreciated from the ensuing description of a preferred embodiment, which should be read in connection with the accompanying drawing.

DETAILED DESCRIPTION OF THE PREFERRED EMBODIMENT

Figure 1:
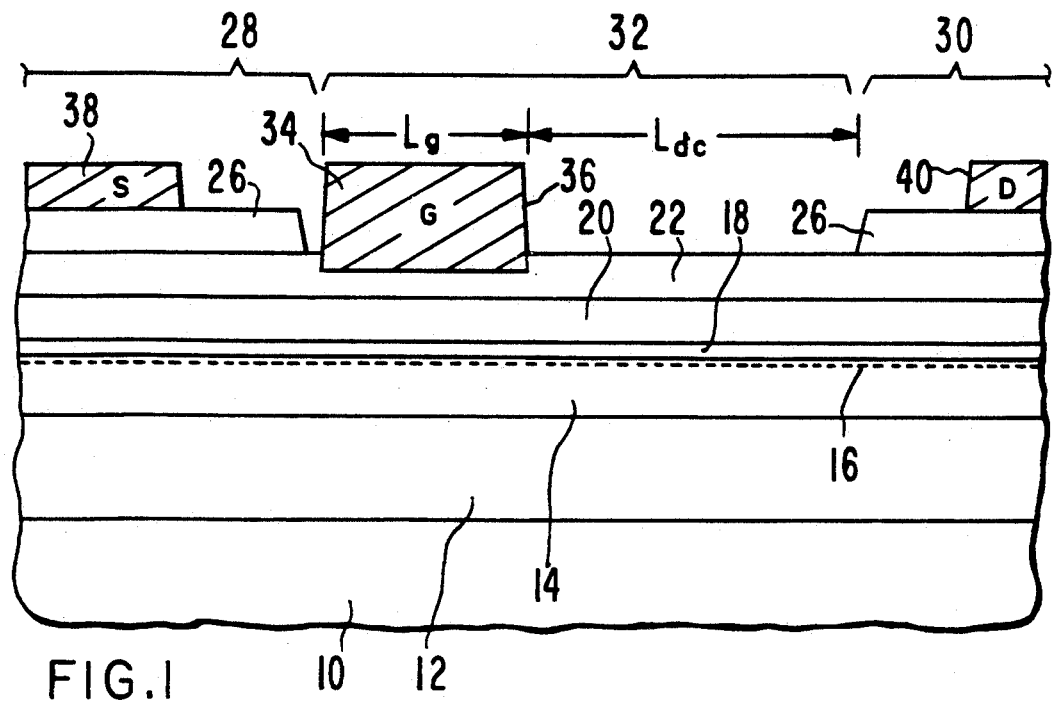
FIG. 1 is a schematic cross sectional view of a HEMT according to an embodiment of this invention.

An embodiment of a high electron mobility transistor (HEMT) or modulation doped field effect transistor (MODFET) is shown schematically in FIG. 1, which employs an InAlAs/InGaAs system on an InP substrate. Alternative embodiments could employ an AlGaAs/GaAs system or an AlGaAs/InGaAs system grown on a GaAs substrate. The large conduction band discontinuity between InAlAs and InGaAs, and a larger -L valley separation (0.55 eV) as compared with AlGaAs and GaAs, favor the use of an InAlAs/InGaAs system for very high-speed device applications. The InAlAs/InGaAs system in a modulation-doped structure has a high two-dimensional electron gas (2DEG) charge density, high electron mobility, and a high peak drift velocity. For these reasons an InAlAs/InGaAs device achieves improved performance in gain and power for microwave and millimeter wave applications.

However, the performance of all such HEMT devices of conventional construction has been limited because of high output conductance and low gate breakdown voltage. These problems are reduced or eliminated in the device described here.

The HEMT of this invention as shown in FIG. 1 is formed of an InAlAs/InGaAs system epitaxially grown on a semi-insulating undoped InP substrate 10. The InAlAs and InGaAs layers were epitaxially grown in a Varian MBE GEN-II system, at a growth rate of 0.3 $\mu$m per hour at a substrate temperature of 490° C. In order to ensure a good crystal lattice match on the indium phosphide substrate, the InAlAs and InGaAs were grown according to the following stoichiometries: In$_{.53}$Ga$_{.47}$As and In$_{.52}$Al$_{.48}$As.

On the substrate 10 is an epitaxially grown buffer layer 12 of undoped InAlAs material, which is the large band-gap semiconductor material. In other embodiments the buffer layer could be small-band gap material, e.g. undoped InGaAs. On the buffer layer 12 is an epitaxially grown layer 14 of undoped InGaAs at a thickness of 320 Å. This layer forms a 2DEG channel 16 below the surface that interfaces with a 30 Å InAlAs undoped spacer layer 18 that is epitaxially grown thereon. On the spacer layer is grown a 250 Å InAlAs layer 20 that is Si-doped to a density of about $2 \times 10^{18}$ cm$^{-3}$. This layer provides the sheet charge for the 2DEG channel 16. Onto this layer 20 is grown a thin InAlAs surface layer 22, which is undoped or only very mildly doped (on the order of $10^{16}$ cm$^{-3}$) so as to have a rather close conductivity to the gated channel conductivity. Preferably, if the layer 22 is doped, it has a sheet charge that is considerably smaller than that of the layer 20 (i.e., 20% or less), and preferably doped to a density of no more than $\times 10^{16}$ cm$^{-3}$.

An optional cap layer 26 is selectively grown on source and drain regions 28 and 30 of highly doped InGaAs material, here to a thickness of about 100Å to 200 Å. Alternatively, this layer could be grown of highly doped InAlAs material. A gate region 32 is defined between the source and drain regions 28,30 and has a Schottky barrier gate electrode 34 is metallized of Ti/Pt/Au by E-beam evaporation, with a gate length Lg in the range of 0.1 to 0.5 $\mu$m, here 0.3 $\mu$m. The gate electrode 34 is offset towards the source region 28 to leave a drain-channel length L$_{dc}$ between a drain-side edge 36 of the gate electrode 34 and the near edge of the heavily doped layer 26 in the drain region 30. This length L$_{dc}$ should be at least 300 Å, and preferably in the range of 500Å to 2000 Å. The length L$_{dc}$ can be selected for a given device depending on the gate length Lg and bias conditions.

Source and drain electrodes 38,40 are metallized, preferably as AuGe/Ni/Au, onto the layer 26 to achieve ohmic contact in the source and drain regions 28,30. Since the layer 22 is quite thin, the source and drain electrodes penetrate electrically into the 2DEG channel 16 to establish ohmic contact, with a contact resistance of approximately 0.3 ohm-mm.

The gate electrode 34 can locate either on top of the surface layer 22, or can locate in a recess in that layer. However, the undoped or lightly-doped surface layer 22 extends across the drain-channel length L$_{ds}$.

In alternative embodiments, the metal source and drain electrodes can be situated directly on the undoped layer 22 with the heavily-doped layer 26 being omitted. Also, selected regions of the surface layer 22 can be doped, e.g. by silicon implantation, at the source and drain regions.

The effect of the undoped or mildly doped layer 22 in the region between the gate electrode 34 and the drain region 30 is to modulate the conductance of the 2DEG channel in the region below this layer.

Figure 2:
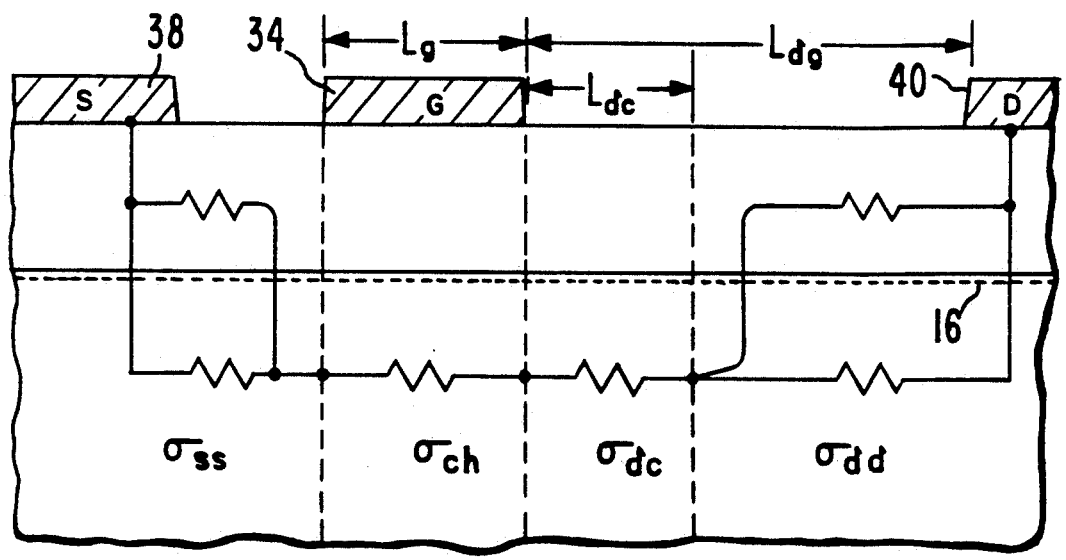
FIG. 2 is a schematic cross sectional view for explaining the enhanced operation of the HEMT of this embodiment.

The basic operational design of the HEMT can be explained with reference the schematic view shown in FIG. 2. The drain-channel length L$_{dc}$ can be less than the entire L$_{dg}$ from gate to drain. The main objective is to keep the conductance $\sigma_{dc}$ in the channel 18 on the drain side of the gate electrode 34 as close as possible to the ungated conductance $\sigma_{ch}$ of the channel 16 in the gate region 32 beneath the gate electrode 34. The drain-channel conductance $\sigma_{dc}$ should be about 1 to 2 times the ungated channel conductances $\sigma_{ch}$. The conductances $\sigma_{ss}$ and $\sigma_{dd}$ in the source and drain regions should be higher than the channel conductance $\sigma_{ch}$ in order to reduce undesired parasitic resistances.

The relative conductances are achieved by the doping and thickness conditions in the sheet charge doped layer 20, at least over the drain channel length L$_{dc}$. The surface layer 22 has a low conductance in this region, and avoids a sharp potential drop in the first several hundred angstroms from the drain-side edge 36 of the gate electrode 34. This spreads out the high electric field domain influencing the channel 18 at the drain side edge 36 of the gate electrode, and reduces the maximum voltage gradient, i.e., maximum electric field, for a given drain-source bias condition.

Figure 3:
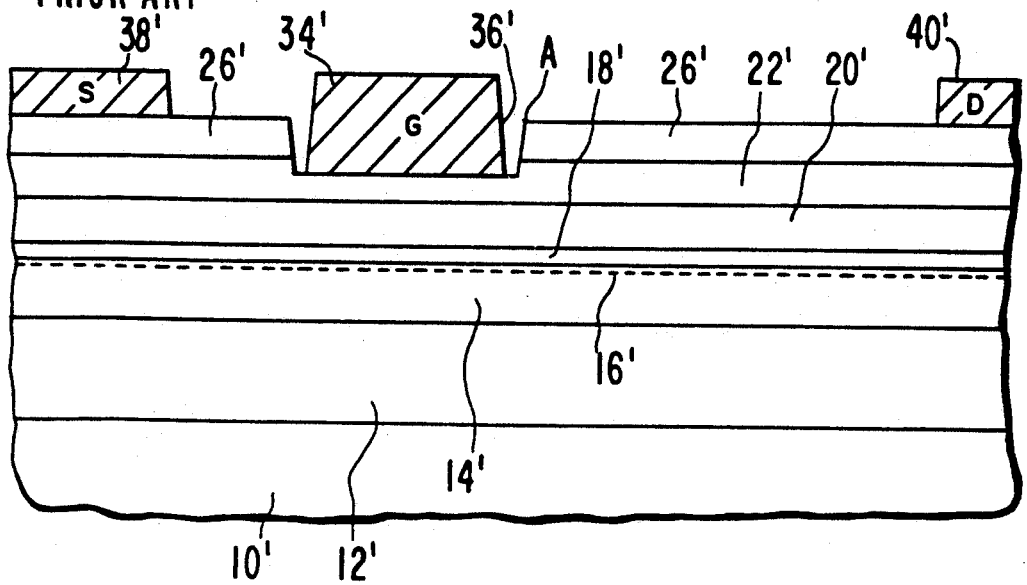
FIG. 3 is a cross sectional view of a HEMT according to the prior art, with a conventional highly-doped surface layer.

A surface-doped HEMT according to the prior art is shown generally in FIG. 3 in which the elements that are similar to those shown in FIG. 1 have the same reference numbers, but primed. Elements that are generally the same as those described earlier need not be discussed in detail. In this case the highly doped layer 26' on the drain side of the gate electrode extends as close to the drain-side edge 36' thereof as a single gate recess process allows.

Because the layer 26' is conductive, the point Å in FIG. 3 nearest the gate electrode 34' is relatively clamped to the positive drain potential $V_{dd}$. On the other hand the gate electrode 34 is generally operated at a negative gate potential. This means that there is a sharp potential gradient in the very short distance between point Å and the drain-side edge 36 of the gate electrode 34'. The large potential gradient can induce significant gate leakage current and also increases the gate to source capacitance. On the other hand, with the HEMT of this invention the gate-to-drain potential gradient is spread more gradually over the drain-channel length $L_{dc}$. This reduces electron injection from the channel layer into the buffer layer, and confines current in the 2DEG channel to reduce both the output conductance $g_o$ and the gate capacitance $C_g$.

Figure 4A:
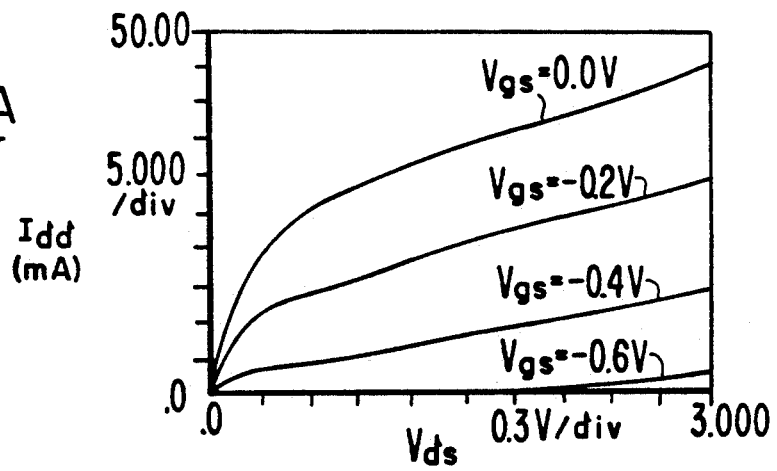
FIGS. 4A and 4B are I-V curves for HEMTs of the prior art and of this invention, respectively.
Figure 4B:
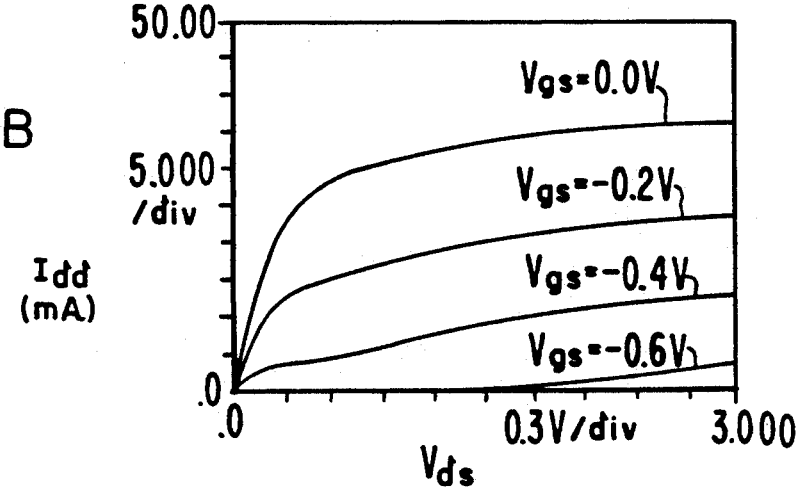

Performance characteristics of the prior-art HEMT of FIG. 3 and the HEMT of FIG. 1 that embodies this invention can be seen in their respective I-V characteristics, as shown in FIGS. 4A and 4B. In this case, the two devices are constructed to have similar dimensions, with source drain currents $I_{dss}$ reasonably close to one another. The major difference appears in the output conductance $g_o$.

For the conventional quarter-micron gate length HEMT of FIG. 3, output conductance is approximately 50 mS/mm, with a maximum extrinsic transductance $g_m$ of 500 mS/mm. For the FIG. 3 HEMT, both $g_m$ and $g_o$ tend to increase at higher source-drain bias $V_{ds}$, and the shape of the $g_m$ versus $V_{gs}$ characteristics remains the same as bias $V_{ds}$ increases from 1 to 3 volts. The FIG. 1 HEMT, on the other hand, exhibits a low output conductance of 10–15 mS/mm, with a maximum extrinsic transconducance $g_m$ of 460 mS/mm. The maximum $g_m$ occurs at relatively low bias $V_{ds}$ (i.e., 0.8–1.2 volts), and decreases when bias $V_{ds}$ is increased.

Figure 5A:
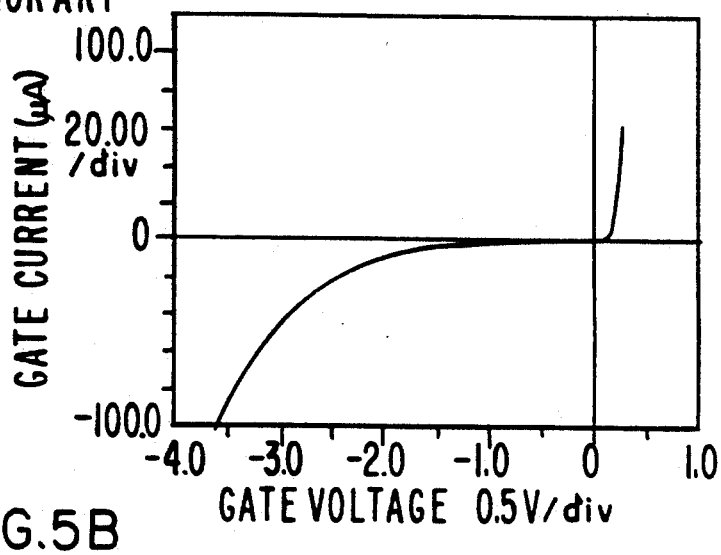
FIGS. 5A and 5B are gate current characteristic curves of the HEMTs of the prior art and of this invention.
Figure 5B:
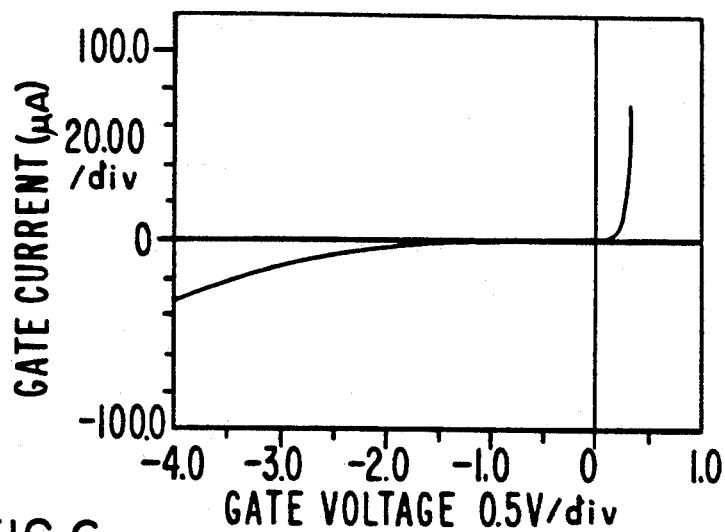

A comparison of the typical gate Schottky behavior for the HEMTs of the prior art and this invention is shown in FIGS. 5A and 5B, respectively. When the gate is negative biased beyond $-1.0$ volts, the conventional HEMT shows a much higher gate leakage current than the invention device.

Figure 6:
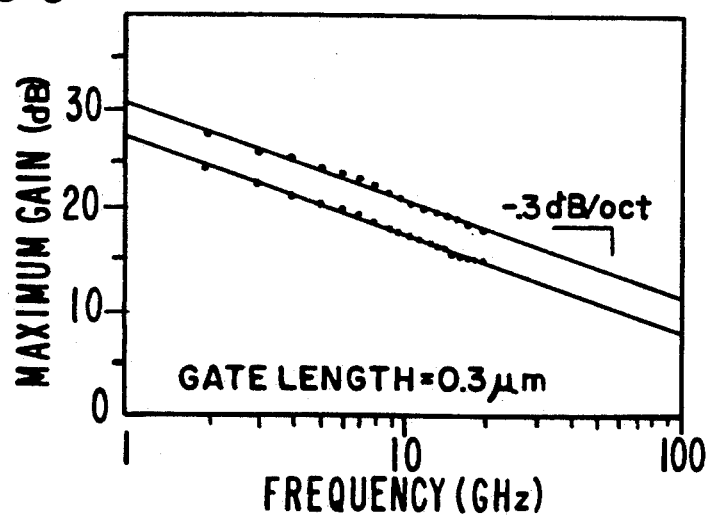
FIG. 6 is a chart comparing the gain to frequency response of the HEMT of this invention with that of the HEMT of the prior art.

Because of the large reduction in output conductance, a much higher $g_m/g_o$ ratio is obtained for the FIG. 1 HEMT. The gate-to-source capacitances are 0.17 pF and 0.19 pF for the FIG. 1 and FIG. 3 HEMTs, respectively. FIG. 6 is a chart showing a comparison of the maximum stable gain (MSG) versus frequency, as between the FIG. 1 and FIG. 3 HEMTs. The HEMT of this invention achieved a respectable maximum gain of 19.2 dB at 18 GHz, due largely to the improved $g_m/g_o$ ratio From S-parameters, when extrapolated at $-6$ dB per octave, both devices show similar unity current gain cut-off frequencies of 70 GHz. However, the extrapolated $f_{max}$ is 190 GHz for the FIG. 1 HEMT compared to 120 GHz for the prior-art (FIG. 3) HEMT.

Figure 7A:
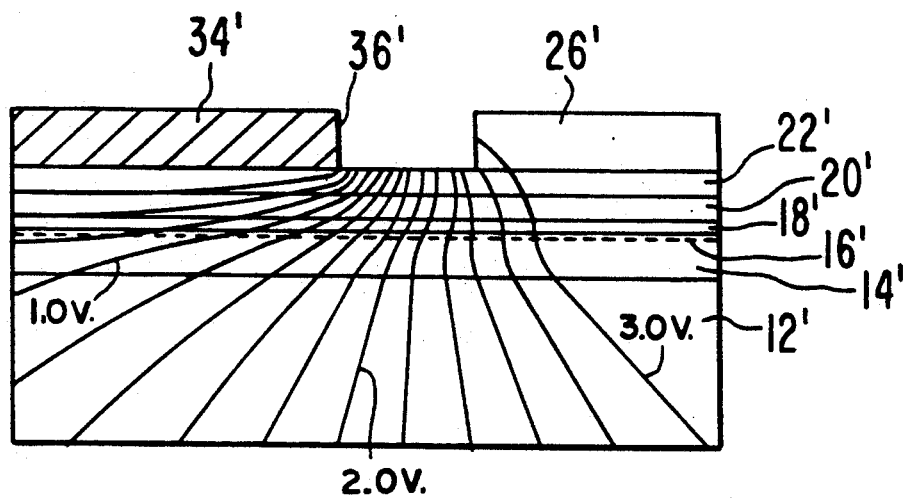
FIGS. 7A and 7B are illustrative potential contour plots for comparing the device of this invention with that of the prior art.
Figure 7B:
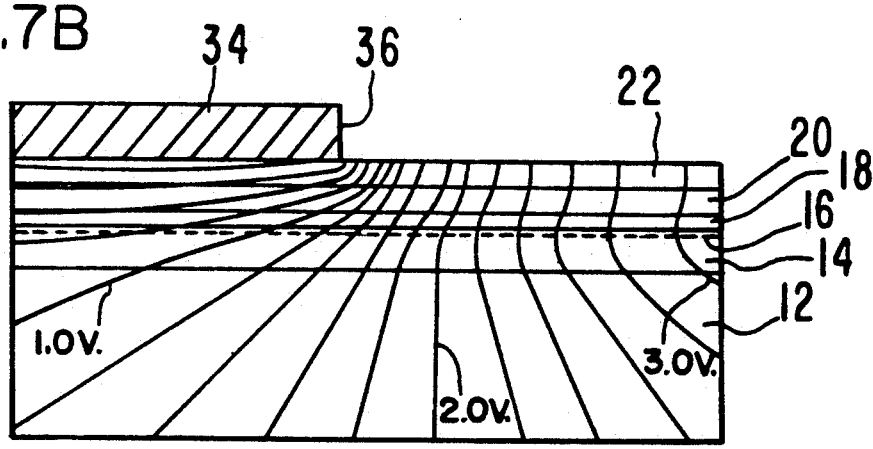

Potential contour plots from a two-dimensional computer simulation (PISCES-II) of quasi-heterostructure for the conventional HEMT and that of the present invention are shown in FIGS. 7A and 7B. Each contour represents a step of 0.2 volts. The drain-source bias voltage is 3.0 volts. The 2DEG channel electric field varies with the spatial position relative to the drain side edge of the gate electrode 34 or 34'. As is clear from FIG. 7 Å, the presence of the highly-doped cap layer 26' compresses these potential contour lines. This field is clearly reduced by spreading the contour lines because of the relatively low drain conductance in the surface layer 22 as shown in FIG. 7B. The electric field domain is spread out between the gate electrode and the drain electrode so that at a distance of about 500 Å from the drain-side edge of the gate electrode, the electric field is at least half the maximum field, i.e., the field at the edge of the gate.

In an extension of this study, two record setting distributed amplifiers have been successfully fabricated using the surface undoped HEMT structures. A single stage, lossy match, cascode coplanar waveguide millimeter-wave monolithic amplifier has achieved a small signal gain of $17+1$ dB and a noise figure of 4–5.5 dB across a frequency band of 24–40 GHz. This is the highest gain per stage reported for mm-wave broad band monolithic amplifier; also fabricated on the surface undoped structure, a five-section distributed amplifier has achieved 6.4 dB gain at 94 GHz, which is the highest frequency MMIC amplifier reported to date. These results demonstrate that the structure of this invention is promising for extreme high frequency and high gain applications.

As can be ascertained the above, by virtue of the undoped or lightly doped surface layer at least between the gate and drain electrodes, the HEMT of this invention achieves low output conductance, and reduced gate capacitance. Because of the controlled sheet conductivity in the surface layer, the field distribution in the channel region between the gate and drain electrodes produces a gradual voltage drop in the 2DEG channel.

While this invention has been described in detail with respect to a single preferred embodiment, it should be recognized that many modifications and variations will present themselves to those skilled in the art without departing from the scope and spirit of this invention as defined in the appended claims.

What is claimed is:

1. HEMT comprising a semi-insulating substrate, a buffer layer on said substrate formed of a substantially undoped semiconductor material, a channel layer of a substantially undoped small-band-gap semiconductor material on said buffer layer, a spacer layer on said channel layer formed of an undoped large-band-gap semiconductor material effective to create a two dimensional electron gas channel in said channel layer, a sheet-charge layer on said spacer layer formed of said large-band-gap semiconductor material doped to achieve an effective sheet charge density on the order of $2 \times 10^{12}$ to $10 \times 10^{12}$ cm$^{-2}$, an undoped to mildly doped surface layer on said sheet charge layer formed of said large-band-gap semiconductor material, a source electrode metallized in a source region on said surface layer, a drain electrode metallized in a drain region on said surface layer and spaced from said source electrode, a gate electrode disposed in a gate region to define a drain-channel region therebetween, said gate electrode being electrically biased to control the conductivity of the two-dimensional electron gas channel beneath the gate electrode, said channel having a predetermined gated conductivity, said drain-channel region producing a drain-channel conductivity, and means included in said surface layer in said drain-channel region extending a distance at least 300 Å from the drain-side edge of the gate electrode to render the drain-channel conductivity substantially 1 to 2 times the gated channel conductivity so that the electric field domain in said region is spread over said distance.

2. The HEMT of claim 1 further comprising a heavily doped layer of semiconductor material on said surface layer in said source region and in said drain region, on which said source and drain electrodes are respectively metallized.

3. The HEMT of claim 2 wherein a recess is formed in said heavily doped layer between said source and drain regions exposing said surface layer, said gate electrode being disposed in said recess offset towards said source region, said gate electrode having a gate length $L_g$, said recess extending from said drain-side edge of said gate electrode a distance $L_{dc}$ to define said drain-channel region, said distance $L_{dc}$ being at least as great as said distance of 300Å.

4. The HEMT of claim 1 wherein said large band gap material and said small band gap material are AlGaAs and GaAs, respectively, and said substrate is GaAs.

5. The HEMT of claim 1 wherein said large band gap material and said small band gap material are InAlAs and InGaAs, respectively, and said substrate is InP.

6. The HEMT of claim 1 wherein said large band gap material and said small band gap material are AlGaAs and InGaAs, respectively, and said substrate is GaAs.

7. The HEMT of claim 1 wherein said surface layer is undoped.

8. The HEMT of claim 1 wherein said surface layer is doped to a density of not more than about $5 \times 10^{16}$ cm$^{-3}$.

9. The HEMT of claim 1 wherein said surface layer has a thickness of 50 to 300 Å.

10. The HEMT of claim 3 wherein said distance $L_{dc}$ is at least 500 Å.

11. The HEMT of claim 1 wherein said surface layer has a net sheet charge density of less than 20% of the sheet charge density of the sheet-charge doped large band gap layer.

12. The HEMT of claim 1 wherein said gate electrode is disposed atop said surface layer in said gate region.

13. The HEMT of claim 1 wherein said gate electrode is disposed in a recess formed in said surface layer in said gate region.

14. The HEMT of claim 1 wherein said drain and source electrodes are metallized of AuGe/Ni/Au.

15. The HEMT of claim 1 wherein said gate electrode is metallized of Ti/Pt/Au.

* * * * *